United States Patent [19]

Higashigaki et al.

[11] Patent Number: 4,714,639
[45] Date of Patent: Dec. 22, 1987

[54] METHODS AND MATERIALS FOR THERMOELECTRIC AND LIGHT-HEAT CONVERSION

[75] Inventors: Yoshiyuki Higashigaki, Kashiwa; Yoshikazu Yoshimoto, Tenri; Tomonari Suzuki, Kashihara; Shigeo Nakajima, Nara; Toshio Inoguchi, Kashihara, all of Japan

[73] Assignee: Sharp Kabushiki Kaisha, Osaka, Japan

[21] Appl. No.: 841,829

[22] Filed: Mar. 20, 1986

[30] Foreign Application Priority Data

Mar. 22, 1985 [JP] Japan .................................. 60-59276
Mar. 26, 1985 [JP] Japan .................................. 60-64571

[51] Int. Cl.$^4$ ...................... B27N 5/02; C01B 31/04; C09C 1/56
[52] U.S. Cl. .......................................... 428/36; 428/35; 428/913; 423/448; 423/460
[58] Field of Search ............... 423/448, 460, DIG. 68; 428/35, 36, 913

[56] References Cited

U.S. PATENT DOCUMENTS 4,009,323 2/1977 Bennion et al. ..................... 429/194
4,403,028 9/1983 Mustacchi et al. ................. 430/178

Primary Examiner—John E. Kittle
Assistant Examiner—Patrick J. Ryan
Attorney, Agent, or Firm—Birch, Stewart, Kolasch & Birch

[57] ABSTRACT

The disclosure is directed to a method for converting between heat energy and electric energy which is characterized in that a carbon intercalation compound is employed as a thermoelectric material by utilizing a temperature difference in a direction perpendicular to the structure of carbon layers, or a method for producing a light-heat converting material which is characterized in that a thin metallic layer like a translucent mirror is caused to adhere to the inner surface of a light transmissive hollow tube by pyrolytically decomposing at a temperature approximately below 1000° C., with hydrocarbons being introduced into the hollow tube at the rate of a predetermined amount per hour.

14 Claims, 2 Drawing Figures

METHODS AND MATERIALS FOR THERMOELECTRIC AND LIGHT-HEAT CONVERSION

BACKGROUND OF THE INVENTION

The present invention relates to a method for converting a certain type of energy to a different type of energy. For example, a method for generating electric energy from a temperature difference and vice versa or a method for converting light energy into heat energy. More particularly, the present invention relates to a method for converting between heat energy and electric energy by employing a carbon intercalation compound as a thermoelectric material, and employing a light-heat converting material to heat a fluid flowing in a hollow tube, wherein a thin carbon layer having metallic luster is accumulated on the inner surface thereof. The present invention also relates to a method for producing such thermoelectric material. as well as a method for producing such a light-heat converting material It is well known that a figure of merit Z is the value for a thermoelectric performance representing a conversion efficiency between heat energy and electric energy. Z-value is estimated by a formula, $Z = \alpha^2/\rho\kappa$, where $\alpha$ is a Seebeck coefficient or a thermoelectric power ($\mu V K^{-1}$), $\rho$ is an electrical resistivity ($\Omega cm$) and $\kappa$ is a thermal conductivity ($W cm^{-1} K^{-1}$). Accordingly, it is obvious that a large $\alpha$, a small $\rho$ and a small $\kappa$ are required for obtaining a large figure of merit Z. On the other hand, in addition to the above conditions, the thermoelectric material is required to have a reliable PN controllability of its own. Furthermore, when used as a thermoelectric generator, the material is required to be operable at high temperatures so as to achieve high thermodynamic efficiency, or when used as a thermoelectric refrigerator, the material is required to realize PN-junction with high heat insulating properties.

Conventionally, various compounds, such as single-crystalline silicon semiconductor, bismuth or antimony chalcogenides, polycrystalline transition-metal silicides, amorphous bismuth chalcogenides or the like, are known as typical thermoelectric materials. However, among graphite intercalation compounds, only one has been found to be used as a thermoelectric material and the material is carbon fiber. Carbon fiber is used as a thermoelectric generator utilizing a temperature difference in the axial direction of fibers wherein an alkali metal or bromine is inserted between carbon layers of carbon fiber. There have been, however, two drawbacks in this practice. The first drawback is that since the axial direction of fibers is parallel to the in-plane direction of a graphite structure, not only the electrical conductivity but also the thermal conductivity is large. Accordingly, inexhaustible high and low heat sources are required for thermoelectric generation, and this results in limited utilization for such a type of thermoelectric material. The second drawback is that, since alkali metal (potassium) or halogen (bromine) which have high reactivity, is employed as the intercalant for the graphite intercalation compound, the thermoelectric material is easily deteriorated by moisture or by oxygen in the air.

Subsequently, in regards to the light-heat converting material, it is well known that upon collection of radiant light by a metal reflected plate or a fluid, such as water or Freon (trade name) gas in a glass tube which is arranged at a position where light each will become collected, is heated. It is more effective to provide the light-heat converting material on the inner surface of the glass tube which comes in contact with the fluid, than on the outer surface thereof, for effectively converting collected light to heat. A soot-like carbon material can be employed for the light-heat converting material in this case, because carbon is superior in light-heat conversion performance and is chemically and thermally stable furthermore, carbon has an extremely large thermal conductivity as compared with glass. There has been, however, a drawback in that the soot-like carbon deposit tends to be peeled from the glass tube due to the mechanical friction between the carbon deposit and the fluid flowing in the tube and as a result, it has not been practical to use.

SUMMARY OF THE INVENTION

Accordingly, an object of the present invention is to provide a highly effective method utilizing the anisotropy of the carbon intercalation compound, for converting between heat energy and electric energy whereby electric energy can be generated from a temperature difference in a direction perpendicular to graphite layers, or the temperature difference in a direction perpendicular to the layers can be generated from electric energy.

Another important object of the present invention is to provide a light-heat converting material for effectively heating a fluid flowing in a hollow tube by providing a thin carbon layer like a translucent mirror on the inner surface thereof.

In accomplishing these and other objects, according to one preferred embodiment of the present invention, there is provided a method for converting between heat energy and electric energy which is characterized in that a carbon intercalation compound is employed as a thermoelectric material by utilizing temperature difference in a direction perpendicular to the carbon layers, or a method for producing a light-heat converting material which is characterized in that a thin metallic film like a translucent mirror is caused to adhere firmly to the inner surface of a light transmissive hollow tube by pyrolytically decomposing hydrocarbons introduced into the hollow tube at the rate of a predetermined amount an hour at a temperature approximately below 1000° C.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
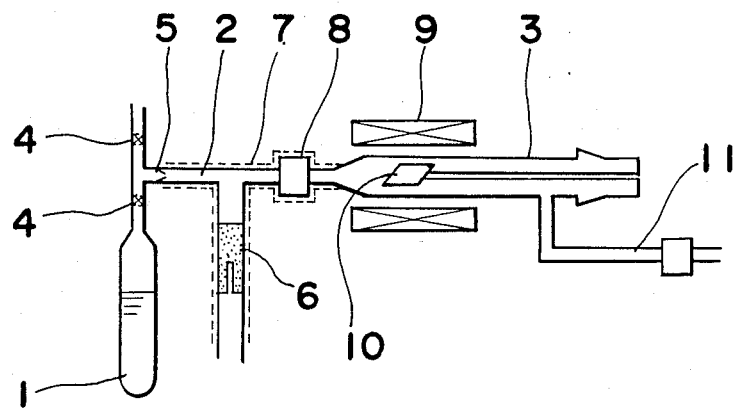
FIG. 1 is a block diagram of an apparatus for producing a carbon intercalation compound, which is employed for producing a thermoelectric material according to one preferred embodiment of the present invention.

Before the description of the present invention proceeds, it is to be noted that like parts are designated by like reference numerals throughout the accompanying drawings.

Semiconductor or semi-metal is generally employed because of easiness of PN control as the thermoelectric material. For example, although a silicon semiconductor is readily PN-controlled, it has a thermal conductivity approximately a quarter of that of copper at room temperature and it seems difficult to improve this value. Furthermore, it is impossible in principle to alter the thermal conductivity and the electrical conductivity independently due to cubic symmetry of the above described semiconductor. On the contrary, the GIC (graphite intercalation compound) can be of the p-type or n-type by arranging a donor or an acceptor type intercalant between carbon layers and it is capable of obtaining the thermoelectric material wherein the electrical conductivity and the thermal conductivity can be altered independently to some extent. So far various kinds of intercalants are known and various kinds of graphite intercalation compounds have been produced. However, since each of such kinds of intercalant layers is bound between the graphite layers by a weak bonding force (van der Waals force or charge transfer force), it tends to easily get free from between the carbon layers in air or in moisture. In order to materialize the thermoelectric material which is characterized by the anisotropy peculiar to graphite intercalation compound, it is necessary to interrupt the movement of the intercalant for fixation thereof. This can be realized by the carbon intercalation compound. In the carbon intercalation compound, carbon atoms having $SP^3$-bond are scattered among a great majority of carbon atoms having $SP^2$-bond to maintain the graphite structure and act to fix the intercalants which are intercalated at the same time when the carbon structure is formed.

In the next place, the performance index number of the thermoelectric material employing the carbon intercalation compound will be explained in detail hereinafter.

Upon comparative examination of a variety of thermoelectric materials, it is conjectured that an electrical resistivity thereof is adequate to be $10^{-3}$ $\Omega$cm. Graphite has both of a resistivity component ($\rho \parallel$) parallel to the layers and that ($\rho \perp$) perpendicular thereto, and $\rho \parallel = 5 \times 10^{-5}$ $\Omega$cm and $\rho \perp = 0.5$ $\Omega$cm. It is well known that the resistivity can be lowered by more than one figure through intercalation. On the other hand, in carbon intercalation compound, the electrical anisotropy is adequately lowered by a small amount of carbon atoms having $SP^3$-bond and as a result, the resistivity of $10^{-3}$ $\Omega$cm can be easily obtained.

At around room temperature, an artificial graphite has thermal conductivities, $\kappa \parallel = 0.8$ $Wcm^{-1}K^{-1}$ and $\kappa \perp = 2 \times 10^{-2} Wcm^{-1}K^{-1}$. When the intercalants are introduced between the layers of host graphite, it has been reported that $\kappa \perp$ can be lowered by $10^{-2}$ to $10^{-3}$ times. Accordingly, in the carbon intercalation compound, the thermoelectric material having thermal conductivity in the range of $10^{-2}$ to $10^{-4}$ $Wcm^{-1}K^{-1}$ can be obtained. Furthermore, the thermoelectric material having lowered thermal conductivity below $10^{-3}$ $Wcm^{-1}K^{-1}$ can be easily obtained by choosing a heavy metal as an intercalant. Thus, upon utilization of the anisotropy of the carbon intercalation compound, the thermoelectric material having the electrical resistivity $\rho = 10^{-3}$ $\Omega$cm and thermal conductivity $\kappa = 10^{-3}$ $Wcm^{-1}K^{-1}$ can be materialized by adjusting the kind and/or the concentration of the intercalant and an existing ratio of carbons having $SP^3$-bond relative to those having $SP^2$-bond.

Subsequently, since the thermoelectric power is a significant physical quantity for the thermoelectric material, it will be described hereinafter.

The coefficient graphite shows such an extremely small thermoelectric power as 5 $\mu VK^{-1}$ at room temperature, with respect to the temperature difference in the graphite layers. It is, however, well known that when antimony pentachloride is intercalated to the extent far below a saturated value (10th-stage), the thermoelectric power thereof is increased to 40 $\mu VK^{-1}$. Furthermore, it has been reported in case of organic charge-transfer complexes that charge-transfer force is a driving force which causes a large thermoelectric power and the value of thermoelectric power is concretely shown by several $mVK^{-1}$.

Hereupon, when the carbon intercalation compound having $\alpha = 10^{-3} VK^{-1}$, $\rho = 10^{-3}$ $\Omega$cm and $\kappa = 10^{-3}$ $Wcm^{-1}K^{-1}$ is employed for the thermoelectric material, the thermoelectric material having $Z = 1K^{-1}$ can be obtained and this value is 100 to 1000 times larger than the conventional Z-value.

In the next place, a method for producing the above described thermoelectric material will be explained hereinafter.

Since graphite is a semi-metal having approximately the same number of electron carriers and hole carriers, if atoms or compounds having electron donating characteristic or electron accepting characteristic can be intercalated into this semi-metal, N-type or P-type electrical conductive material can be materialized. The intercalant layer has a staged structure alternating with the graphite layers.

The carbon intercalation compounds can be bulk-produced with reliable reproducibility by introducing at a same time atoms or compounds to be intercalated in the process wherein carbon deposit having metallic luster is elaborated by employing a CVD method for hydrocarbons.

FIG. 1 shows a block diagram of an apparatus for producing the carbon intercalation compound, which is employed to produce the thermoelectric material according to one preferred embodiment of the present invention.

A hydrocarbon compound such as aliphatic hydrocarbons, or more preferably aromatic hydrocarbons can be used as starting materials and these kinds of hydrocarbons are pyrolytically decomposed at approximately 1000° C. Concretely, such a hydrocarbon can be used as cyclohexane, n-hexane, benzene, biphenyl, anthracene, hexamethylbenzene, 1,2-dibromoethylene, 2-butyne, acetylene, diphenylacetylene or the like. Depending upon the kind of hydrocarbon to be used, one of a bubbling method, an evaporation method, a sublimation method or the like method can be employed as a supplying method into a reaction tube which is later explained in detail, and the supply rate is controlled to be constant below several millimols an hour. This constant value considerably depends upon the kind of the starting material. When the supply rate exceeds the predetermined constant value, the carbon deposit obtained has a fairly uneven surface which results in the production of soot-like carbon deposit.

Silicon, sapphire, silicon carbide ($\alpha$-type and $\beta$-type), boron nitride, kish graphite, highly orientated graphite or the like is used as a single-crystalline substrate on which the thin carbon film is formed and the single-crystalline substrate is required to satisfy conditions in which its property is not changed at the reaction temperature of approximately 1000° C.

In FIG. 1, benzene is selected as a starting material and the evaporating method is employed for producing the thermoelectric material.

Vapor of benzene molecules is led to a quartz reaction tube 3 through a pyrex glass tube 2 from a raw material receptacle 1 wherein benzene purified through vacuum distillation is accommodated. Upon operation of cocks 4, benzene molecules vaporized from the raw material receptacle 1 is supplied to the glass tube 2 and the amount thereof to be supplied is determined by means of a glass capillary 5 arranged on the glass tube 2. Furthermore, an organometal reagent comprising heavy metal accommodated in a chamber 6 is mixed with benzene molecules in the course of the glass tube 2 so as to be simultaneously fed into the reaction tube 3 together therewith. The glass tube 2 is covered with a heating tape 7 so as to be kept at its desired temperature and is connected with the reaction tube 3 through a pyrex-quartz conversion joint. The reaction tube 3 is inserted into a heating furnace 9 so as to be heated up to the reaction temperature and a substrate holder 10 is disposed in the reaction tube 3 for placing a single-crystalline substrate thereon, which enables the carbon deposit to grow up. The remaining vapor led to the reaction tube 3 is discharged outside through a discharge pipe 11.

Inside of the reaction tube 3 is kept at a temperature of approximately 1000° C. by the heating furnace 9 and thereafter, benzene molecules which are controlled in the supply rate thereof by the capillary 5 and the molecules of the organometal comprising heavy metal are supplied to the reaction tube 3 by a constant amount at the rate of several millimols in total an hour. Benzene molecules led into the reaction tube 3 are pyrolytically decomposed at the above described temperature and the carbon deposit having metallic luster are formed on the single-crystalline substrate. At this moment, since the organometal comprising heavy metal is also pyrolytically decomposed and heavy metal atoms are intercalated between the layers of carbon deposit, the carbon deposit obtained is the carbon intercalation compound composing the above described thermoelectric material. The carbon intercalation compound produced is a thin layer which has received a desirable crystallization under the influence of the single-crystalline substrate and is highly orientated at a lowered temperature as compared with that of conventional case. In addition, benzene molecules led into the reaction tube 3 and the organometal molecules are controlled at a constant amount, and the carbon deposit produced on the single-crystalline substrate is even in thickness and accordingly, the carbon deposit having an improved crystallization can be obtained, with the surface thereof having metallic luster.

As is seen from the foregoing description, by the converting method between heat energy and electric energy which utilizes the anisotropy of the carbon intercalation compound, the figure of merit of the thermoelectric material which is more than 100 times larger than the conventional number can be obtained, and a considerably desirable effect can be expected in case of thermoelectric generation or thermoelectric cooling.

Subsequently, a method for producing a light-heat converting material will be explained hereinafter.

Figure 2:
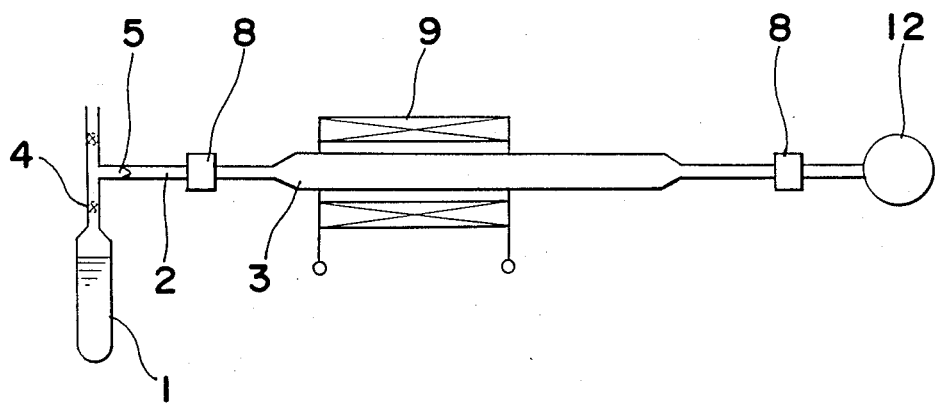
FIG. 2 is a block diagram of an apparatus for producing a light-heat converting material according to another preferred embodiment of the present invention.

FIG. 2 is a block diagram of an apparatus for producing a light-heat converting material according to one preferred embodiment of the present invention.

A hydrocarbon such as benzene, anthracene, n-hexane, cyclohexane, biphenyl, acetylene etc. or a heterocyclic compound like pyridine is used as a starting material for forming a thin carbon layer which turns to be a light-heat converting film.

Hereupon, pyridine is selected as a starting material and the evaporating method is employed for producing the light-heat converting material in this embodiment. Furthermore, the process which overlaps with that in the method for producing the thermoelectric material will be also described for easy understanding.

Pyridine purified through vacuum distillation is evaporated from a raw material receptacle 1 wherein pyridine is accommodated and thereafter, pyridine molecules are led into a quartz glass reaction tube 3 from one end thereof through a supply tube 2 made of pyrex glass or the like. A cock 4 is arranged on the outlet side of the raw material receptacle 1 and a glass capillary 5 is provided on the supply tube 2. A required amount of pyridine is replenished through an inlet tube which is arranged above the raw material receptacle 1. The glass capillary 5 plays the role to maintain a supply rate of pyridine molecules to the reaction tube 3 approximately below several millimols an hour and also to prevent pyridine molecules from being supplied in a decreased amount accompanying temperature drop of the pyridine receptacle 1 due to evaporation of pyridine molecules. The reaction tube 3 is inserted into a movable type heating furnace 9 so as to be heated up to the reaction temperature. Thermal expansion of the reaction tube 3 is absorbed at pyrex-quartz conversion joints 8 arranged on the supply tube 2. The other end of the reaction tube 3 is connected to an exhaust system 12 so that the gas inside thereof is discharged to the exhaust system 12.

Inside of the reaction tube 3 is first maintained at the reaction temperature of approximately 950° C. by the heating furnace 9 and the capillary 5 is adjusted so as to control the supply rate of pyridine molecules which are led into the reaction tube 3 to be several millimols an hour. Pyridine molecules led into the reaction tube 3 are pyrolytically decomposed at the above described temperature and a carbon accumulated layer is caused to adhere firmly to inner surface of the reaction tube 3. The carbon accumulated layer is even in thickness and turns to have a smooth surface with metallic luster which is one of the characteristics the translucent mirror has. The carbon layer having a thickness of 0.05 to 0.13 micrometer, preferably, 0.08 micrometer is superior in light-heat conversion performance. When the heating furnace 9 is moved along the reaction tube 3, a thin carbon layer can be formed on all over the inner surface of the reaction tube 3, even if it has a long length. Upon removal of the quartz reaction tube 3 to which the thin carbon layer is caused to adhere firmly, when a fluid is let flow into the hollow reaction tube 3 having a light transmissive characteristic and the sunlight or the like is applied thereto, the fluid is heated up under the influence of light-heat conversion effect through the thin carbon layer and the temperature of the fluid goes up as the fluid flows in the reaction tube 3.

Electric power required for maintaining the reaction tube 3 at the reaction temperature of 950° C. is decreased by 30%, when the reaction tube 3 having the thin carbon film formed on the inner surface thereof is used, as compared with that without the thin carbon film. This means that heat-light conversion performance is improved by 30% due to the fact that the thin carbon layer like a translucent mirror is caused to adhere firmly to the inner surface of the quartz reaction tube 3. The thin carbon film has a favorable surface condition and is caused to adhere firmly to the inner surface of the reaction tube 3, free from being peeled off and the like problem.

It is to be noted here that the reaction temperature in the reaction tube 3 should be below 1000° C., because the carbon layer with a fairly uneven surface is undesirably obtained at a temperature over 1100° C. and accordingly, it is difficult to obtain the thin carbon film like a translucent mirror.

According to the above described embodiment of the present invention, since it is possible to firmly cover the inner surface of the hollow tube having optional figures with the thin carbon film like a translucent mirror, a converting efficiency between light energy and heat energy can be considerably increased.

It is also to be noted that although the evaporating method has been explained in the above described embodiments as a method for producing the thermoelectric or light-heat converting material, the present invention is not limited by this method and various kinds of liquid transfer methods in which the flow amount can be relatively precisely adjusted can be employed for the same purpose, for example, a bubbling method in which raw material liquid is bubbled by injecting inert gas such as argon gas or the like into a raw material such as hydrocarbon or the like and thereby raw material molecules are led into the reaction tube 3 together with the inert gas, or a sublimation method in which raw material is sublimated so that the vapor thereof is transferred, can be employed for producing the thermoelectric or light-heat converting material.

One of the above described methods can be properly selected in accordance with a melting point or a boiling point of the hydrocarbon to be used.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A material capable of converting light energy into heat energy comprising
   a hollow light transmissive member having a thin carbon layer adhered to the inner surface of the hollow member,
   said layer having a translucent mirror metallic luster characteristic.

2. The material of claim 1, in which the layer is of an even thickness of 0.05 to 0.13 micrometer.

3. The material of claim 2, in which the even thickness is 0.08 micrometer.

4. The material of claim 1, in which the hollow member is a hollow tube.

5. The material of claim 1, in which the hollow member is a quartz glass reaction tube.

6. A method for producing a material capable of converting light energy into heat energy comprising:
   introducing a hydrocarbon or a heterocyclic compound into a hollow light transmissive member at the rate of a predetermined amount per hour,
   pyrolytically decomposing said hydrocarbon or said heterocyclic compound at a temperature of approximately below 1000° C., and
   forming a thin carbon layer onto the inner surface of said hollow member, said layer having a translucent mirror metallic luster characteristic.

7. The method of claim 6, in which the layer formed is of an even thickness of 0.05 to 0.13 micrometer.

8. The method of claim 7, in which the even thickness is 0.08 micrometer.

9. The method of claim 6, in which the hollow member is a hollow tube.

10. The method of claim 6, in which the hollow member is a quartz glass reaction tube.

11. The method of claim 6, in which the hydrocarbon is introduced.

12. The method of claim 11, in which the hydrocarbon is selected from benzene, anthracene, n-hexane, cyclohexane, biphenyl or acetylene.

13. The method of claim 6, in which a heterocyclic compound is introduced.

14. The method of claim 13, in which the heterocyclic compound is pyridine.

* * * * *